United States Patent
Norman

(10) Patent No.: US 7,903,485 B2
(45) Date of Patent: Mar. 8, 2011

(54) INTEGRATED CIRCUITS AND METHODS TO COMPENSATE FOR DEFECTIVE NON-VOLATILE EMBEDDED MEMORY IN ONE OR MORE LAYERS OF VERTICALLY STACKED NON-VOLATILE EMBEDDED MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/807,836

(22) Filed: Sep. 14, 2010

(65) Prior Publication Data
US 2011/0007589 A1    Jan. 13, 2011

Related U.S. Application Data

(63) Continuation of application No. 12/001,335, filed on Dec. 10, 2007, now Pat. No. 7,796,451.

(51) Int. Cl.
*G11C 29/00* (2006.01)

(52) U.S. Cl. .................. 365/200; 365/185.09; 365/210.1

(58) Field of Classification Search .................. 365/200, 365/185.09, 210.1
See application file for complete search history.

(56) References Cited

U.S. PATENT DOCUMENTS

| | | |
|---|---|---|
| 2005/0047226 A1* | 3/2005 | Martinelli et al. ............ 365/200 |
| 2005/0057961 A1* | 3/2005 | Ahmad ......................... 365/154 |

* cited by examiner

*Primary Examiner* — Anh Phung
*Assistant Examiner* — Toan Le

(57) ABSTRACT

Embodiments of the invention relate generally to data storage and computer memory, and more particularly, to systems, integrated circuits and methods to compensate for defective memory in third dimension memory technology. In a specific embodiment, an integrated circuit is configured to compensate for defective memory cells. For example, the integrated circuit can include a memory having memory cells that are disposed in multiple layers of memory. It can also include a memory reclamation circuit configured to substitute a subset of the memory cells for one or more defective memory cells. At least one memory cell in the subset of the memory cells resides in a different plane in the memory than at least one of the one or more defective memory cells.

20 Claims, 9 Drawing Sheets

INTEGRATED CIRCUITS AND METHODS TO COMPENSATE FOR DEFECTIVE NON-VOLATILE EMBEDDED MEMORY IN ONE OR MORE LAYERS OF VERTICALLY STACKED NON-VOLATILE EMBEDDED MEMORY

CROSS-REFERENCE TO RELATED APPLICATIONS

This application is a continuation of U.S. patent application Ser. No. 12/001,335, filed Dec. 10, 2007, now U.S. Pat. No. 7,796,451. This application incorporates by reference the following related application: U.S. patent application Ser. No. 11/095,026, filed Mar. 30, 2005, and titled "Memory Using Mixed Valence Conductive Oxides," which has published as U.S. Pub. No. 2006/0171200.

FIELD OF THE INVENTION

Embodiments of the invention relate generally to data storage and computer memory, and more particularly, to systems, integrated circuits and methods for compensating for defective memory in multiple layers of memory implementing, for example, third dimension memory technology.

BACKGROUND OF THE INVENTION

Conventional semiconductor fabrication processes have reduced device geometries in the x, y and z directions so as to facilitate the fabrication of relatively dense memory cells. Memories having higher densities, however, are vulnerable to increased defect rates (e.g., defects per unit area). To salvage memory that otherwise would be lost due to defects, memory designers usually include extra memory to replace defective memory.

A common approach to salvaging memory divides a memory into multiple, equivalently-sized groupings in which each row in a grouping is a separate, isolated collection of memory cells. A Flash memory array, for example, can be partitioned into four equal areas. By partitioning memory in this manner, a memory is less susceptible to fatal defects that otherwise render the entire memory (i.e., the aggregate of all groupings) inoperative. To illustrate, consider that a defect in an unpartitioned memory causes an entire column to fail. As such, the entire memory array is unusable. But if the memory is partitioned, the defect will at most affect only the grouping in which the defect resides. This allows the memory to remain usable, albeit with less memory capacity. To recover lost memory, some memories traditionally include extra rows in each grouping to replace a limited number of rows having defects. These extra rows are typically selected by programming bits stored in non-volatile registers to indicate which one of a number of substitute alternate rows will be used to replace a defective row. Therefore, each grouping is usually associated with a dedicated set of non-volatile registers. Further, each grouping usually includes an extra decoder to uniquely select each of the extra rows.

While this approach is functional, it has its drawbacks. First, extra rows, non-volatile registers, and extra decoders, if used, collectively consume amounts of surface area in traditional memory architectures. This, in turn, increases the die size (i.e., in the X and Y dimensions). Second, memory designers are typically faced with deciding how many extra memory rows to add to each grouping, especially since memory fabrication processes can randomly cause any number of unforeseen defects. If a memory designer adds too many extra rows, then any unused memory that does not remedy a defect will unnecessarily increase the die size. But if the memory designer adds too few extra rows, then the memory array cannot support its intended memory capacity, which decreases the yield of good memories. Third, conventional row replacement techniques, as described above, do not usually adapt to the different defects rates that each grouping experiences. For example, consider that each of eight groupings includes five extra rows to replace five defective rows, if necessary. Next, consider that a fabrication process introduces defects in each memory as follows: one of the eight groupings has six defective rows while the other groupings have two defective rows. As is common, the extra rows in the other groupings cannot be used to replace the sixth defective row, and, thus, that row renders its grouping inoperative. Fourth, accessing the extra rows using conventional row replacement techniques can ordinarily have longer access times than accessing the main array, especially if the detection of defects and implementation of the extra rows are performed, for example, serially.

There are continuing efforts to improve techniques, systems and devices for compensating for defects in memory.

BRIEF DESCRIPTION OF THE FIGURES

The invention and its various embodiments are more fully appreciated in connection with the following detailed description taken in conjunction with the accompanying drawings, in which.

Figure 1:
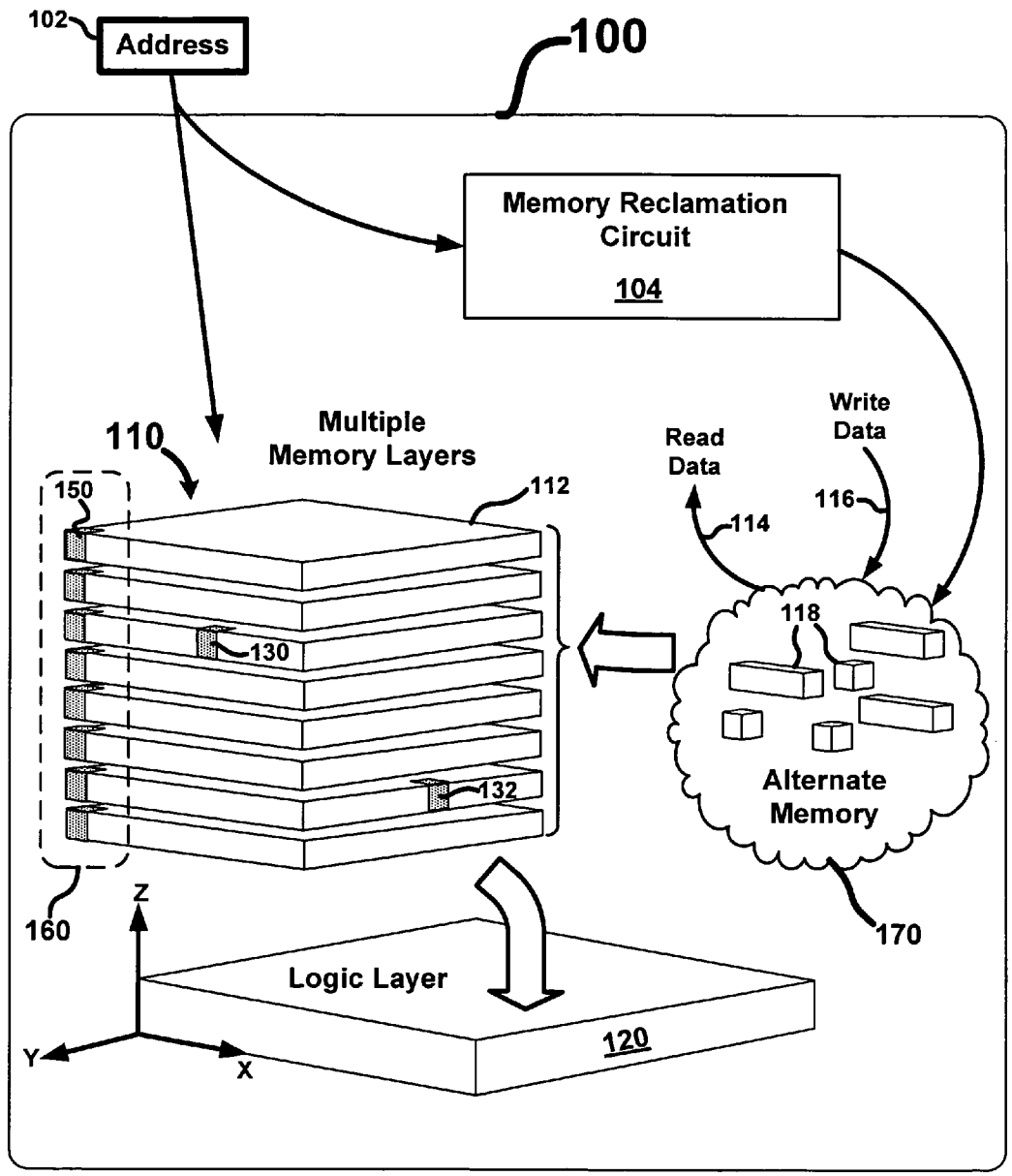
FIG. 1 illustrates an integrated circuit implementing a memory reclamation circuit configured to compensate for defects in a memory composed of multiple memory layers, according to at least one embodiment of the invention.

Like reference numerals refer to corresponding parts throughout the several views of the drawings. Note that most of the reference numerals include one or two left-most digits that generally identify the figure that first introduces that reference number. Although the Drawings depict various examples of the invention, the invention is not limited by the depicted examples. Furthermore, the depictions are not necessarily to scale.

DETAILED DESCRIPTION

FIG. 1 illustrates an integrated circuit implementing a memory reclamation circuit configured to compensate for defects in a memory composed of multiple memory layers, according to at least one embodiment of the invention. Integrated circuit 100 includes a memory reclamation circuit 104, a memory 110 including multiple memory layers 112 formed on top of each other (e.g., in the Z dimension), alternate memory 170 and a logic layer 120. Memory 112 is configured to reclaim memory that otherwise would be unavailable due to, for example, defects. As shown, multiple layers of memory 112 can include subsets 118 of alternate memory 170, each including any number of memory cells that operate as substitute memory for defective memory cells. In one embodiment, at least one memory cell in a subset 118 of memory cells can reside in a different plane in memory 110 than at least one defective memory cell. For example, one or more memory cells 132, which form a subset 118 of alternate memory 170, can reside in a different plane than one or more defective memory cells 130. As used herein, a "plane" refers, at least in one embodiment, to a flat, conceptual surface passing containing, for example, the X and Y axes, the Y and Z axes, or the Z and X axes, as well as any similar surface that is parallel to any of the aforementioned axes. Memory reclamation circuit 104 is configured to substitute a subset 118 of memory cells for one or more defective memory cells in memory 110, whereby the defective memory cells and the substitute memory cells in subsets 118 can be distributed anywhere throughout multiple memory layers 112 of memory 110.

In view of the foregoing, a designer can add alternate memory 170 in memory 110 without increasing the die size of, for example, logic layer 120 or the substrate (not shown) upon which logic layer 120 is formed. Specifically, adding alternate memory 170 in multiple layers of memory 112 predominantly affects the Z dimension of integrated circuit 100 rather than the X and Y dimensions. As such, implementation of alternate memory 170 facilitates defective memory replacement without increasing the die size to include alternate memory 170 in logic layer 120 or on the substrate.

Also, memory reclamation circuit 104 is further configured to implement subsets 118 of memory cells, which can be located anywhere in memory 110, to replace defective memory cells, which also can be located anywhere in memory 110. As such, integrated circuit 100 can implement more subsets 118 of memory cells to reclaim a higher concentration of memory cells succumbing to defects in certain regions, and can implement fewer subsets 118 of memory cells for substituting defective memory in other regions that have a lower concentration of defects. In at least one instance, memory reclamation circuit 104 can vary an amount of memory cells in alternate memory 170 to reclaim memory in different regions having different numbers of defects per region, thereby obviating the segregation of fixed number of substitute memory cells in a fixed relationship to separate parts of a memory. This improves the usage of substitute memory that otherwise might be unused. As used herein, a "region" in memory refers, at least in one embodiment, to a grouping of memory cells with which a rate of defects (e.g., a number of defects per unit region) can be determined. For example, a region can be any layer of multiple layers 112, any row in a layer, any packet (e.g., number of bits or memory cells) in a row, as well as any volume that includes memory cells in, for example, a portion of each layer in a subset of multiple layers 112.

Further, memory reclamation circuit 104 can be configured to detect an access to defective memory cells 130, and, in response, divert the access to a subset 118 of memory cells, whereby the diversion is in parallel, or is substantially in parallel, with the access. This is at least in part due to the collaboration of third dimension memories, which have relatively small sizes and fast access times, with memory reclamation circuit 104. As such, a user will generally not experience noticeably different time delays between memory cells in the main arrays of memory 110 and in alternate memory 170. Additionally, parallel access to alternate memory 170 facilitates expeditious compensation of defective memory, which otherwise might not be the case. As used herein, an "access" refers, at least in one embodiment, to a data operation, such as a write operation (e.g., applying write data 116), a read operation e.g., retrieving read data 114), or any other memory operation. In a specific embodiment, memory reclamation circuit 104 functions to at least detect an address 102 of an access to a defective memory cell. In at least one embodiment, memory reclamation circuit 104 is a single memory reclamation circuit serving memory reclamation for all of memory 110.

In at least one embodiment, the memory cells of memory 110 are third dimension memory cells. U.S. patent application Ser. No. 11/095,026, filed Mar. 30, 2005, now U.S. Published Application No. 2006/0171200, and titled "Memory Using Mixed Valence Conductive Oxides," is hereby incorporated by reference to describe one example of a third dimension memory cell. A memory is "third dimension memory" when it is fabricated above other circuitry components, the components usually including a silicon substrate, polysilicon layers and, typically, metallization layers. By using non-volatile third dimension memory arrays, memory systems can be vertically configured to reduce die size and while preserving overall functionality of an integrated circuit. In at least one instance, a third dimension cell can be a two-terminal memory element that changes conductivity as a function of a voltage differential between a first terminal and a second terminal. In some instances, the third dimension cell can be formed with an electrolytic tunnel barrier and a mixed valence conductive oxide. A voltage drop across the electrolytic tunnel barrier causes an electrical field within the mixed valence conductive oxide that is strong enough to move oxygen ions out of the mixed valence conductive oxide and into the electrolytic tunnel barrier. Oxygen depletion causes the mixed valence conductive oxide to change its valence, which causes a change in conductivity. Data can be stored in the two-terminal memory element as a plurality of conductivity profiles that can be sensed (e.g., as a read current) by applying a read voltage across the two-terminal memory element. Both the electrolytic tunnel barrier and the mixed valence conductive oxide do not need to operate in a silicon substrate, and, therefore, can be fabricated above circuitry being used for other purposes (such as selection circuitry). FIG. 5A is a block diagram representing the basic components of one embodiment of a memory element 550, FIG. 5B is a block diagram of the memory element 550 in a two-terminal memory cell. FIG. 5A shows an electrolytic tunnel barrier 555 and an ion reservoir 560, two basic components of the memory element 550. FIG. 5B shows the memory element 550 between a top memory electrode 565 and a bottom memory electrode 570. The orientation of the memory element (i.e., whether the electrolytic tunnel barrier 555 is near the top memory electrode 565 or the bottom memory electrode 570) may be important for processing considerations, including the necessity of seed layers and how the tunnel barrier reacts with the ion reservoir 560 during deposition.

Referring back to FIG. 5A, the electrolytic tunnel barrier 555 will typically be between 10 and less than 50 Angstroms. If the electrolytic tunnel barrier 555 is much greater than 50 Angstroms, then the voltage that is required to create the electric field necessary to move electrons through the memory element 550 via tunneling becomes too high for most electronic devices. Depending on the electrolytic tunnel barrier 555 material, a preferred electrolytic tunnel barrier 555 width might be between 15 and 40 Angstroms for circuits where rapid access times (on the order of tens of nanoseconds, typically below 100 ns) in small dimension devices (on the order of hundreds of nanometers) are desired. Fundamentally, the electrolytic tunnel barrier 555 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, MgO, or $Y_2O_3$, or doped with materials such as scandium. The electrolytic tunnel barrier 555 will typically be of very high quality, being as uniform as possible to allow for predictability in the voltage required to obtain a current through the memory element 550. Although atomic layer deposition (ALD) and plasma oxidation are examples of methods that can be used to create very high quality tunnel barriers, the parameters of a particular system will dictate its fabrication options. With standard designs, the electric field at the tunnel barrier 555 is typically high enough to promote tunneling at thicknesses between 10 and 50 Angstroms. The electric field is typically higher than at other points in the memory element 550 because of the relatively high serial electronic resistance of the electrolytic tunnel barrier 555. The high electric field of the electrolytic tunnel barrier 555 also penetrates into the ion reservoir 560 at least one Debye length. The Debye length can be defined as the distance which a local electric field affects distribution of free charge carriers. At an appropriate polarity, the electric field within the ion reservoir 560 causes ions (which can be positively or negatively charged) to move from the ion reservoir 560 through the electrolytic tunnel barrier 555, which is an ionic electrolyte. The ion reservoir 560 is a material that is conductive enough to allow current to flow and has mobile ions. The ion reservoir 560 can be, for example, an oxygen reservoir with mobile oxygen ions. Oxygen ions are negative in charge, and will flow in the direction opposite of current. Referring back to FIG. 5A, certain ion reservoirs 560 have the physical property of being less conductive in an oxygen-deficient state. Some examples of materials that have mobile oxygen ions and are less conductive in an oxygen-deficient state include certain perovskites (a perovskite generally being in the form of an $ABX_3$ structure, where A has an atomic size of 1.0-1.4 Å and B has an atomic size of 0.45-0.75 Å for the case where X is either oxygen or fluorine) such as $SrRuO_3$ (SRO), $Pr_{0.7}Ca_{0.3}MnO_3$, $Pr_{0.5}Ca_{0.5}MnO_3$ and other PCMOs. Many of these ion reservoirs 560 are potentially mixed valence oxides. For example, PCMO might be more conductive when its manganese ion is in its $Mn^{3+}$ state, but less conductive when its manganese ion is in its $Mn^{4+}$ state.

Further, third dimension memory cells in memory 110 can be produced with equivalent fabrication processes that produce logic layer 120. As such, both can be manufactured in the same or different fabrication plants, or "fabs," to form integrated circuit 100 on a single substrate. This enables a manufacturer to first fabricate logic layer 120 using a CMOS process in a first fab, and then port logic layer 120 to a second fab at which additional CMOS processing can be used to fabricate multiple memory layers 112 directly on top of logic layer 120. Note that memory 110 can be vertically stacked on top of logic layer 120 without an intervening substrate. In at least one embodiment, multiple memory layers 112 are fabricated to arrange the third dimension memory cells in a stacked cross point array. In particular, two-terminal memory elements can be arranged in a cross point array such that one terminal is electrically coupled with an X-direction line and the other terminal is electrically coupled with a Y-direction line. A stacked cross point array includes multiple cross point arrays stacked upon one another, sometimes sharing X-direction and Y-direction lines between layers 112, and sometimes having isolated lines. Both single-layer cross point arrays and stacked cross point arrays may be arranged as third dimension memories.

Note that memory 110, which can also be referred to as a "memory array," in some embodiments, can be implemented using layers 112 of memory elements arranged in blocks or sub-blocks to store data. By utilizing third dimension memory, driving voltage requirements can be met by using multiple, smaller charge pumps in some cases. Further, multiple, simultaneous accesses of memory elements in a memory array can be performed. While various types and designs of charge pump circuits can be used, the implementation of multiple, smaller charge pumps in a third dimension memory allows for die size to be reduced while improving the capabilities of integrate circuit 100, such as faster access times for performing multiple, simultaneous programmable sequences.

In one embodiment, subsets 118 of memory cells in alternate memory 170 can have one or more spatial arrangements that are different than that of one or more defective memory cells. As used herein, a "spatial arrangement" of memory cells can refer, at least in one embodiment, to an arrangement of specific numbers of memory cells that are located and/or oriented differently from the defective memory cells. And an arrangement of memory cells as one of subsets 118 can constitute any of the following: an extra layer of third dimension memory cells 112, a spare row (or sector) in a layer 112, a spare portion of a row, such as a packet (e.g., any number of bits), a spare block of memory, and any other arrangement of memory cells. For example, consider that one row of substitute memory cells can be located in a different layer 112 than a row that includes a defective memory, whereby the one row of substitute memory cells can replace the row in memory 110 that contains the defect. As another example, a spare row can be oriented as vertical row 160, which is composed of vertically-stacked memory cells 150.

Figure 2:
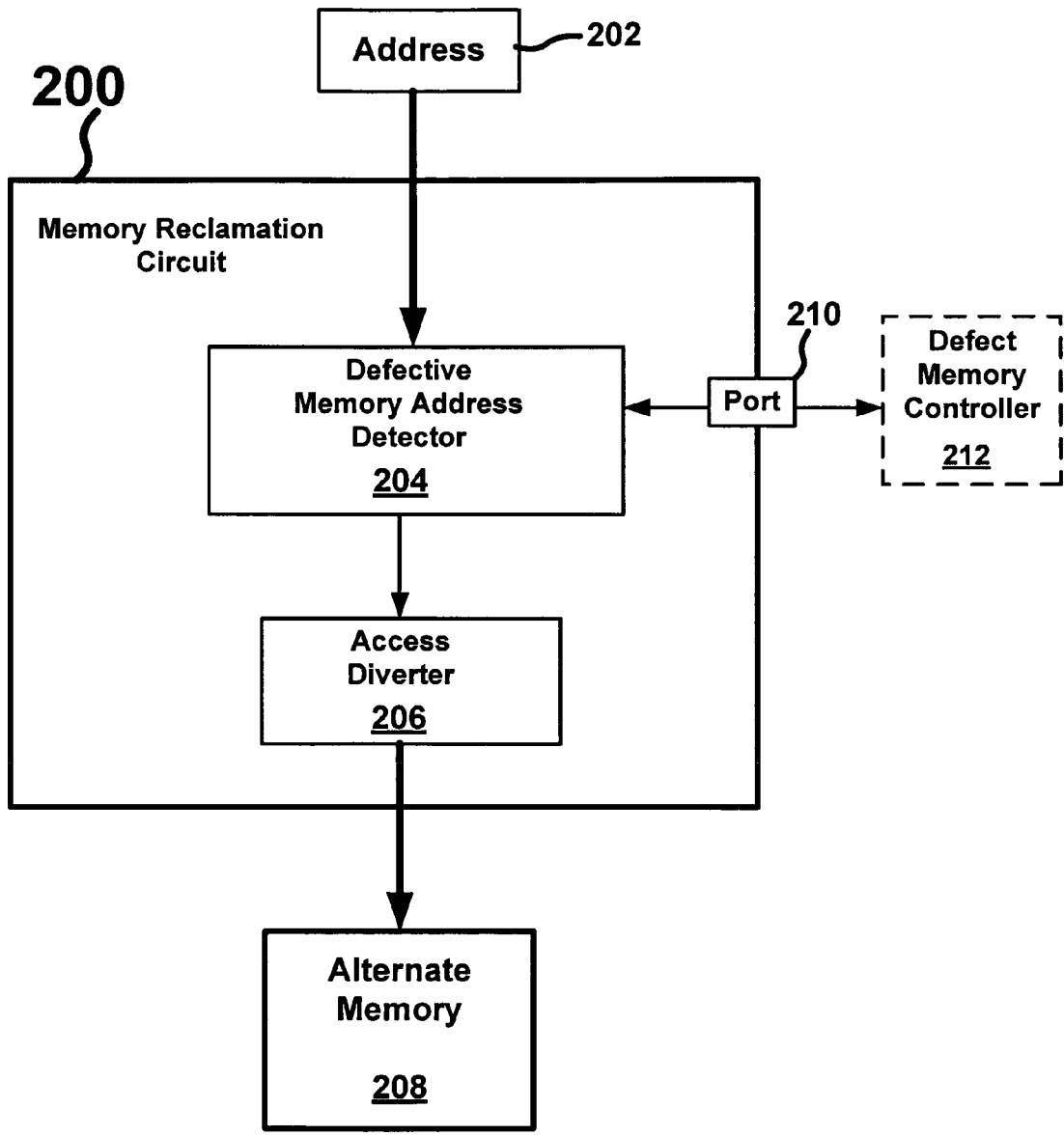
FIG. 2 is a block diagram detailing an example of a memory reclamation circuit, according to one embodiment of the invention.

FIG. 2 is a block diagram detailing an example of a memory reclamation circuit, according to one embodiment of the invention. In this example, memory reclamation circuit 200 includes a defective memory address detector 204 configured to detect an address 202 for accessing a memory location having a defect in one or more third dimension memory cells. Upon detecting address 202 for a defective memory, defective memory address detector 204 identifies an alternate memory location for substituting the defective memory location. Also, defective memory address detector 204 sends an address of the alternate memory location to an access diverter 206, which is configured to divert the access to the alternate memory location in alternate memory. Access diverter 206 can be configured to divert write operations to an alternate memory 208 (e.g., to write data) and to divert read operations from the alternate memory 208 (e.g., to read data). In one embodiment, memory reclamation circuit 200 is configured to convert address 202, which is associated with the defective memory location, into an alternate memory address identifying substitute memory cells.

In one embodiment, memory reclamation circuit 200 includes a port 210 configured to receive address 202 from a defect memory controller 212. In operation, defect memory controller 212 tests the main memory array for defects, identifies those defects and stores the defective memory addresses in, for example, a defective memory list in or associated with defective memory address detector 204. In some cases, defect memory controller 212 can be production test equipment configured to program defective memory address detector 204 at, for example, wafer sort. In other cases, defect memory controller 212 can be integrated into a circuit including memory reclamation circuit 200, thereby providing for in-situ defect reclamation in view of defects arising during use in memory applications.

Figure 3:
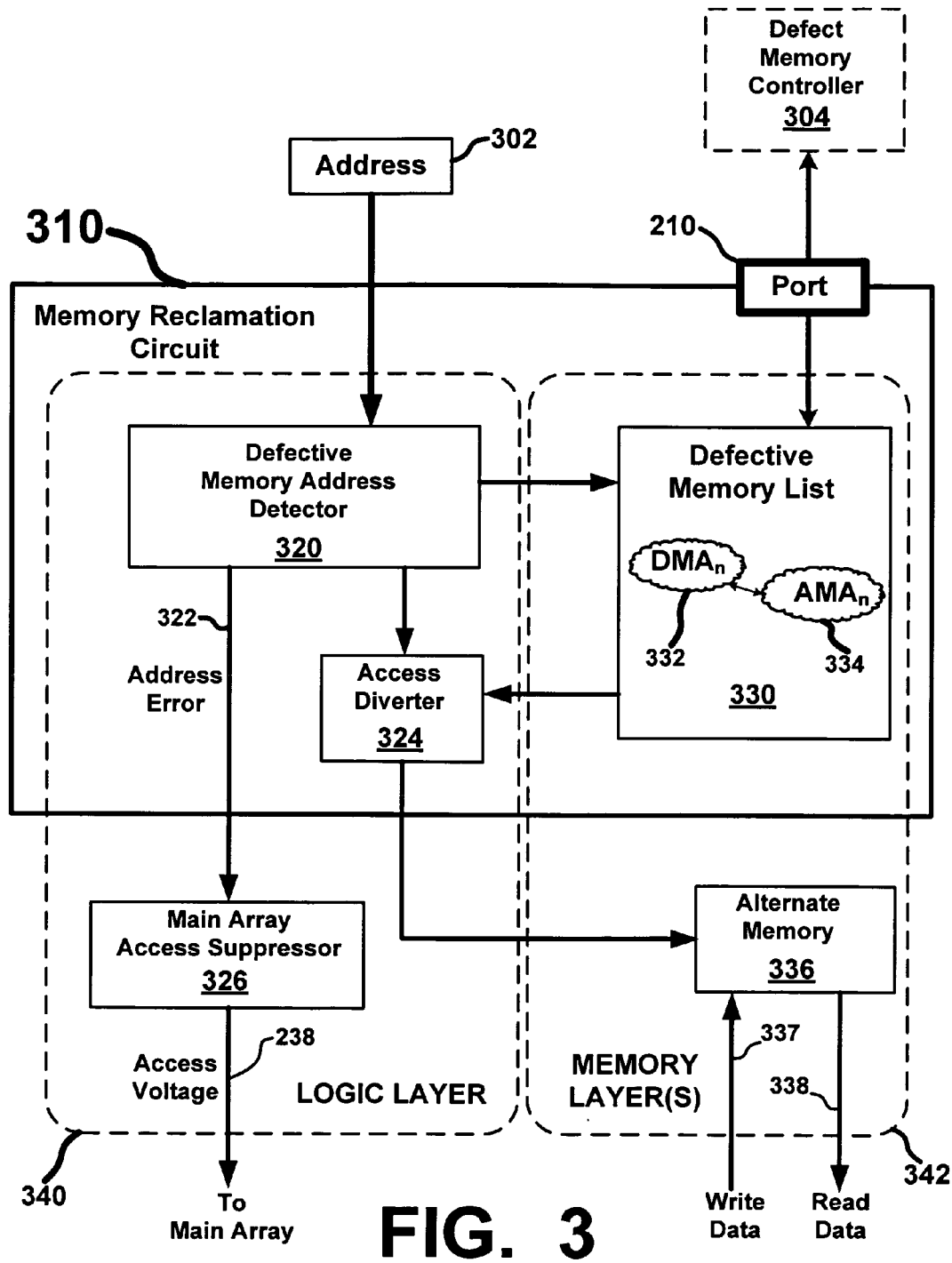
FIG. 3 is a block diagram detailing another example of a memory reclamation circuit, according to another embodiment of the invention.

FIG. 3 is a block diagram detailing another example of a memory reclamation circuit, according to another embodiment of the invention. In this example, memory reclamation circuit 310 includes a defective memory address detector 320, an access diverter 324 and storage for a defective memory list 330. Initially, defect memory controller 212 operates to program N number of defective memory addresses ("DMAn") 332 via port 210 into defective memory list 330. Each of defective memory addresses 332 corresponds to an alternate memory address ("AMAn") 334. In operation, defective memory address detector 320 is configured to detect an address 302 for accessing a memory location having a defect. In one embodiment, defective memory address detector 320 performs a comparison between address 302 and defective memory addresses 332 to determine a match. Upon detecting address 302, defective memory address detector 320 uses the defective memory address 332 to identify alternate memory address 334, which is sent to access diverter 324. In a specific embodiment, memory reclamation circuit 310 converts address 302 into an alternate memory address 334 identifying substitute memory cells in an alternate memory 336.

Access diverter 324 can be configured to use alternate memory address 334 to divert the access from the defective memory location in the main memory array to the alternate memory location in alternate memory. Specifically, access diverter 324 can operate to divert the write data 337 to, and read data 338 from, alternate memory 336.

In some embodiments, memory reclamation circuit 310 includes a first portion 340 formed in a logic layer and a second portion 342 being formed in one or more layers in a third dimension memory. In particular, first portion 340 can include at least a portion of defective memory address detector 320 and at least a portion of access diverter 324, and second portion 342 can include storage for a defective memory list 330 and alternate memory locations in alternate memory 336. Both portions 340 and 342 can be formed using a CMOS fabrication process. In at least one embodiment, a portion of defective memory address detector 320 can include a part of defective memory list 330 (e.g., defective memory addresses 332 and/or relationships to alternate memory address 334), and a portion of access diverter 324 can include another part of defective memory list 330 (e.g., alternate memory address 334).

Further to the example shown, defective memory address detector 320 generates an address error signal 332 configured to suppress access to the defective memory location. As such, defective memory address detector 320 can be configured to suppress the access to the memory location in the main memory array coincident, or substantially coincident, to access diverter 324 diverting the access to alternate memory 336. In one embodiment, an integrated circuit including memory reclamation circuit 310 also contains a main array access suppressor 326. Responsive to address error signal 326, main array access suppressor 326 is configured to suppress application of an access voltage 238 to a main array (not shown) of third dimension memory cells. Access voltage 238 includes write voltages and/or read voltages. Note that alternate memory 336 can reside in memory reclamation circuit 310 in some embodiments.

Figure 4:
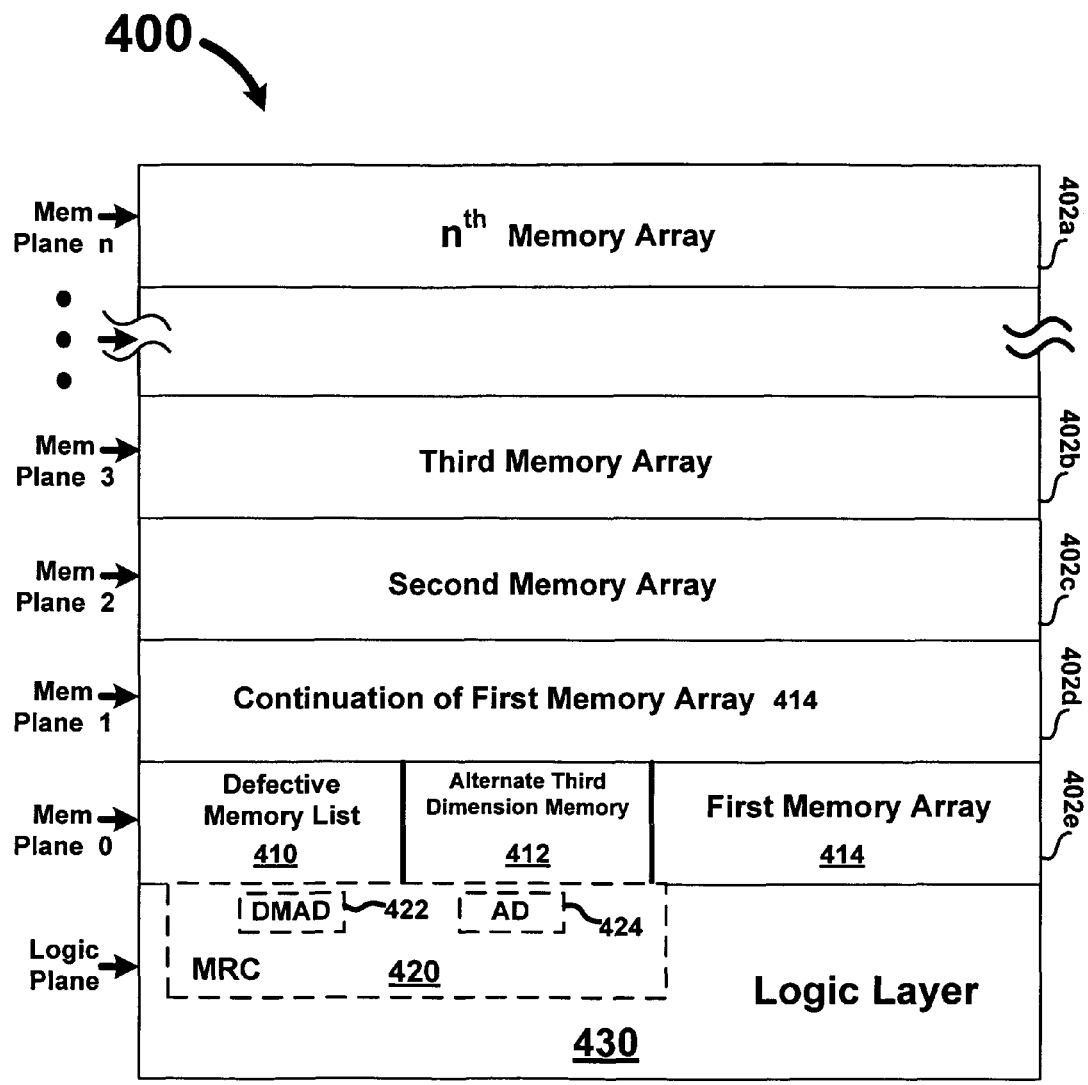
FIG. 4 depicts a cross-section view of an example of an integrated circuit implementing a memory reclamation circuit, according to one embodiment of the invention.

FIG. 4 depicts a cross-section view of an example of an integrated circuit implementing a memory reclamation circuit, according to one embodiment of the invention. Cross-section view 400 shows multiple memory layers being vertically disposed above or on a logic layer 430, which can include logic circuitry for implementing defective memory replacement, and a semiconductor substrate upon which the logic circuitry can be formed. The logic circuitry, for example, can include a memory reclamation circuit ("MRC") 420 having a defective memory address detector circuit ("DMAD") 422 and an access diverter circuit ("AD") 424. Multiple memory layers can include a first layer 402e having a first group 410 and a second group 412 of third dimension memory cells operable as a defective memory list and an alternate third dimension memory, respectively. Note that the first group 410 and the second group 412 of third dimension memory cells can be placed in other memory planes or sub-planes, and therefore, need not be restricted to layer 402e. First layer 402e also contains a portion of a first memory array 414, which continues into second layer 402d of third dimension memory cells. A third layer 402c, a fourth layer 402b and an Nth layer 402a include third dimension memory cells for a second array, a third array, and an Nth array, respectively. In other embodiments, the multiple memory layers shown in cross-section view 400 can include more or fewer layers than as shown in FIG. 4, any of which can emulate other types of memory technologies. Note that in this example each of the multiple memory layers is oriented in the X and Y plane, each plane being designated by "Mem Plane." Logic layer 430 is shown to lie in a base plane designated as "logic plane."

Figure 5:
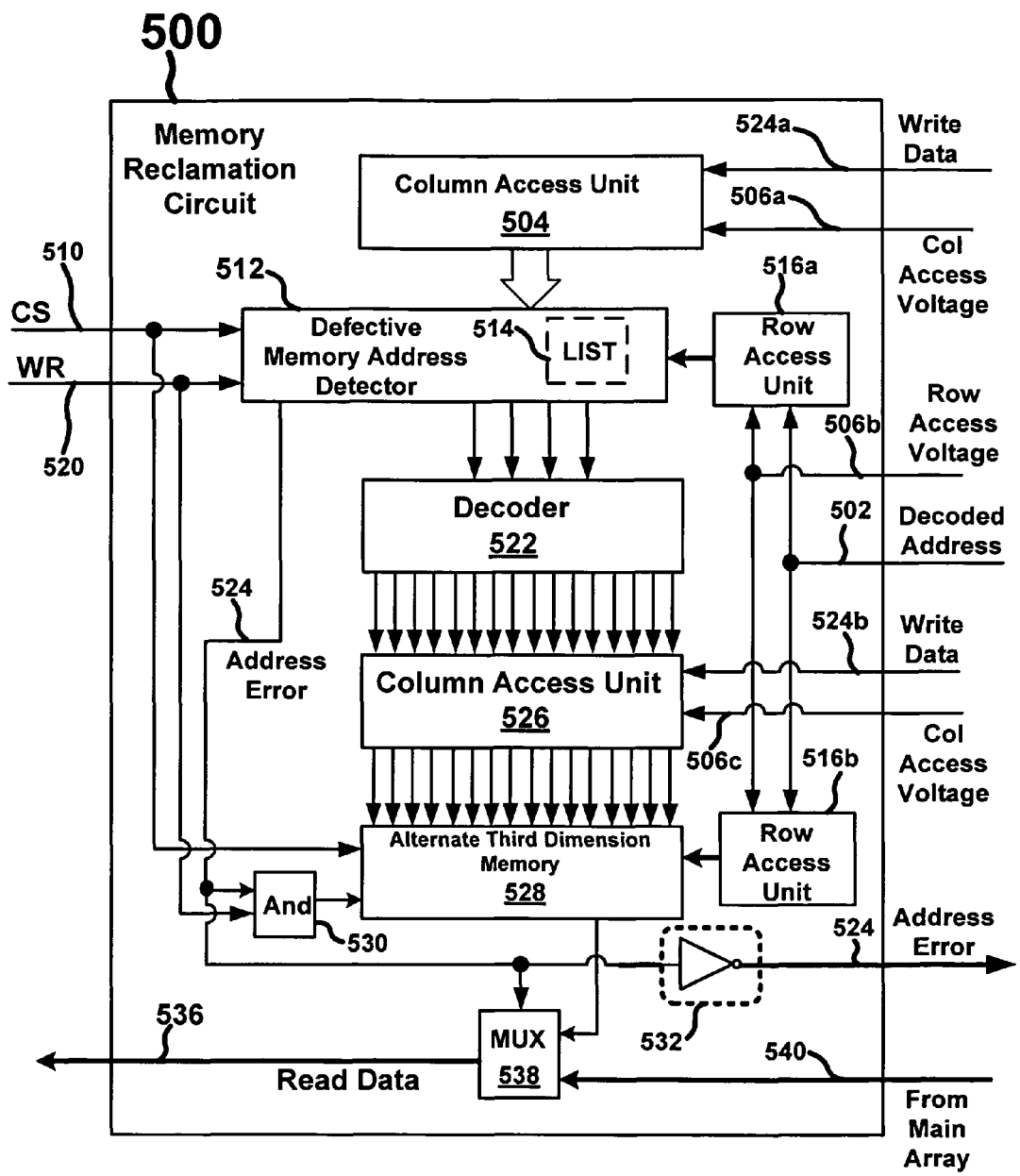
FIG. 5 depicts an example of a memory reclamation circuit, according to one embodiment of the invention.
Figure 5A:
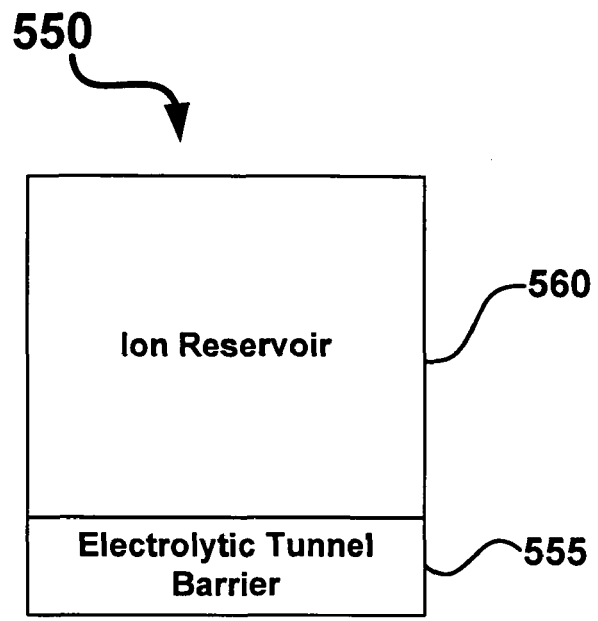
FIG. 5A depicts a block diagram representing the basic components of one embodiment of a memory element.
Figure 5B:
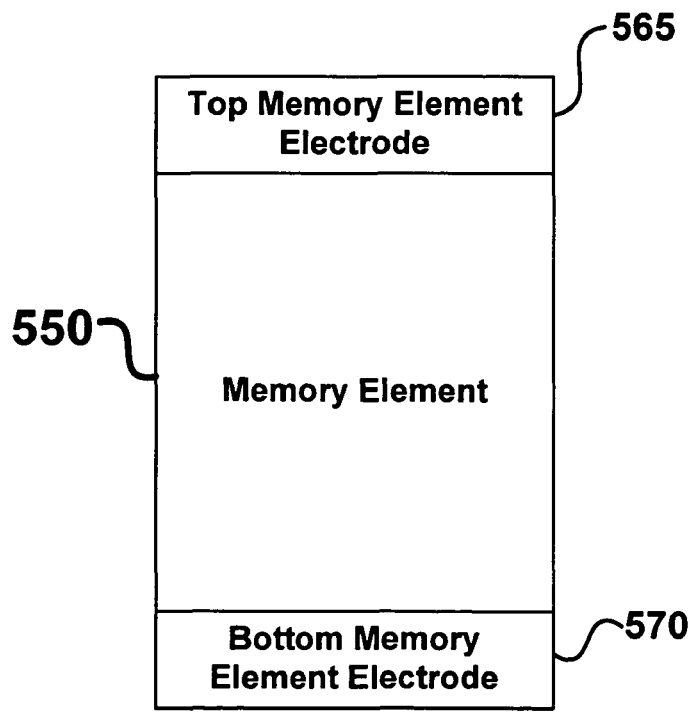
FIG. 5B depicts a block diagram of the memory element of FIG. 5A in a two-terminal memory cell.

FIG. 5 depicts an example of a memory reclamation circuit, according to one embodiment of the invention. Memory reclamation circuit 500 includes a first column access unit 504, a defective memory address detector 512, a decoder 522, a second column access unit 526, an alternate third dimension memory 528, and two row access units 516a and 516b. Memory reclamation circuit 500 is configured to operate in two modes: a programming mode and a functional mode.

In programming mode, a defective memory list ("LIST") 514 is programmed into defective memory address detector 512 to record a list of defective memory locations requiring substitution. A decoded address 502 selects the row into which write data 524a is to be programmed. In programming mode, write data 524a represents a defective memory address and at least a relationship to an alternate memory address. To initiate programming, a chip select signal ("CS") 510 and write enable signal ("WR") 520 can be applied to memory reclamation circuit 500 to program a third dimension memory constituting list 514. Column access unit 504 and row access unit 516a cooperate to program list 514. For example, column access unit 504 can logically AND a column access voltage 506a (e.g., a "col. write voltage") with select address bits of decoded address 502 to determine which column lines (e.g., Y-lines) will be driven with write data 524a. In one example, the select column bits are determined by a column decoder (not shown). Row access unit 516a performs a similar function, but rather determines a unique row for programming. For example, row access unit 516a can logically AND a row access voltage 506b (e.g., a "row write voltage") with select decoded row bits, thereby applying voltages to a unique row line (e.g., X-line). Note that AND gate 530 prevents programming of alternate third dimension memory 528 during programming mode. The functionality of AND gate 530 is discussed below. In one embodiment, the addresses in list 514 can be set to be above the memory address range of the main memory array to avoid access to the main array during programming mode. In various embodiments, the magnitudes of the access voltages for the columns and row can be set to values that are appropriate for third dimension memory cells, for example.

In functional mode, alternate third dimension memory 528 is accessed during write and read operations to defective memory. But first consider write operations and read operations in connection with non-defective memory in the main array (not shown). During write operations to non-defective memory, defective memory address detector 512 does not generate an active address error signal 524 (e.g., it is low). For write operations, defective memory address detector 512 generates address error signal 524 having a low state during a write to non-defective memory. It is the low state of address error signal 524 in this example that disables write enable signal 520 at AND gate 530. The inactive, or low, state of address error signal 524 bars writes to alternate third dimension memory 528. For read operations to non-defective memory, a low address error signal 524 causes multiplexer ("MUX") 538 to route read data 540, which originates from the main array, through as read data 536.

Now consider write operations and read operations with defective memory in the main array. In both cases, defective memory address detector 512 generates an active address error signal 524 (e.g., it is high) upon detection of an access to defective memory. For write operations, defective memory address detector 512 generates an active address error signal 524 (e.g., it is in a high state) during write operations, which is ANDed with write enable signal 520. The output of AND gate 530 enables writes to alternate third dimension memory 528 as substitute memory. For read operations, address error signal 524 in a high state causes multiplexer 538 to block read data 540 and to send read data 536 from alternate third dimension memory 528.

When access to a defective memory address is detected, memory reclamation circuit 500 transmits address error signal 524 to suppress at least the write and read operations with the main array. Also, memory reclamation circuit 500 accesses list 514 to determine an alternate memory address. Both of these events can occur in parallel (or substantially in parallel). In operation, read voltage levels generated by both column access voltage 506a and row access unit 516a, as well as decoded address 502, are applied to list 514. List 514 is then examined in parallel with main array access operations.

If memory reclamation circuit 500 detects a defective memory address, a corresponding alternate memory address for that defective memory address will be generated to divert access from a specific memory location in the main array to an alternate memory location in alternate third dimension memory 528. Defective memory address detector 512 transmits bits representing an alternate memory address to decoder 522, which, in turn, uses this encoded alternate memory address to activate a single line for accessing a row of alternate third dimension memory 528. For example, if the alternate memory address can be represented by fours bits to cover addresses 0000 to 1111 (e.g., addresses 0 to 16), decoder 522 will output a signal on one of 16 lines. It is understood that different numbers of bits can be used across different memory designs and can be large in quantity than in the previous example. In one embodiment, address error signal 524 can be inverted for external use using inverter 532.

If the access operation is a write operation, AND gate 530 provides a write enable signal 520 to alternate third dimension memory 528. Also, column access voltage 506c is applied to column access unit 526, and a row access voltage 506b is applied to row access unit 516b, whereby the access voltages can provide for writing of write data 524b into an alternate memory location, rather then the main array. But if the access operation is a read operation, both column access voltage 506c and row access voltage 506b are applied at access voltage magnitudes that are sufficient to output data via MUX 538 as read data 536. In various embodiments, one or more of the following can constitute an access diverter: decoder 522, logic for diverting write operations and read operations, such as AND gate 530, with alternate third dimension memory 528, column access unit 526, row access unit 516b, and any other circuit that can—in whole or in part— divert access from the main array to an alternate memory.

Figure 6:
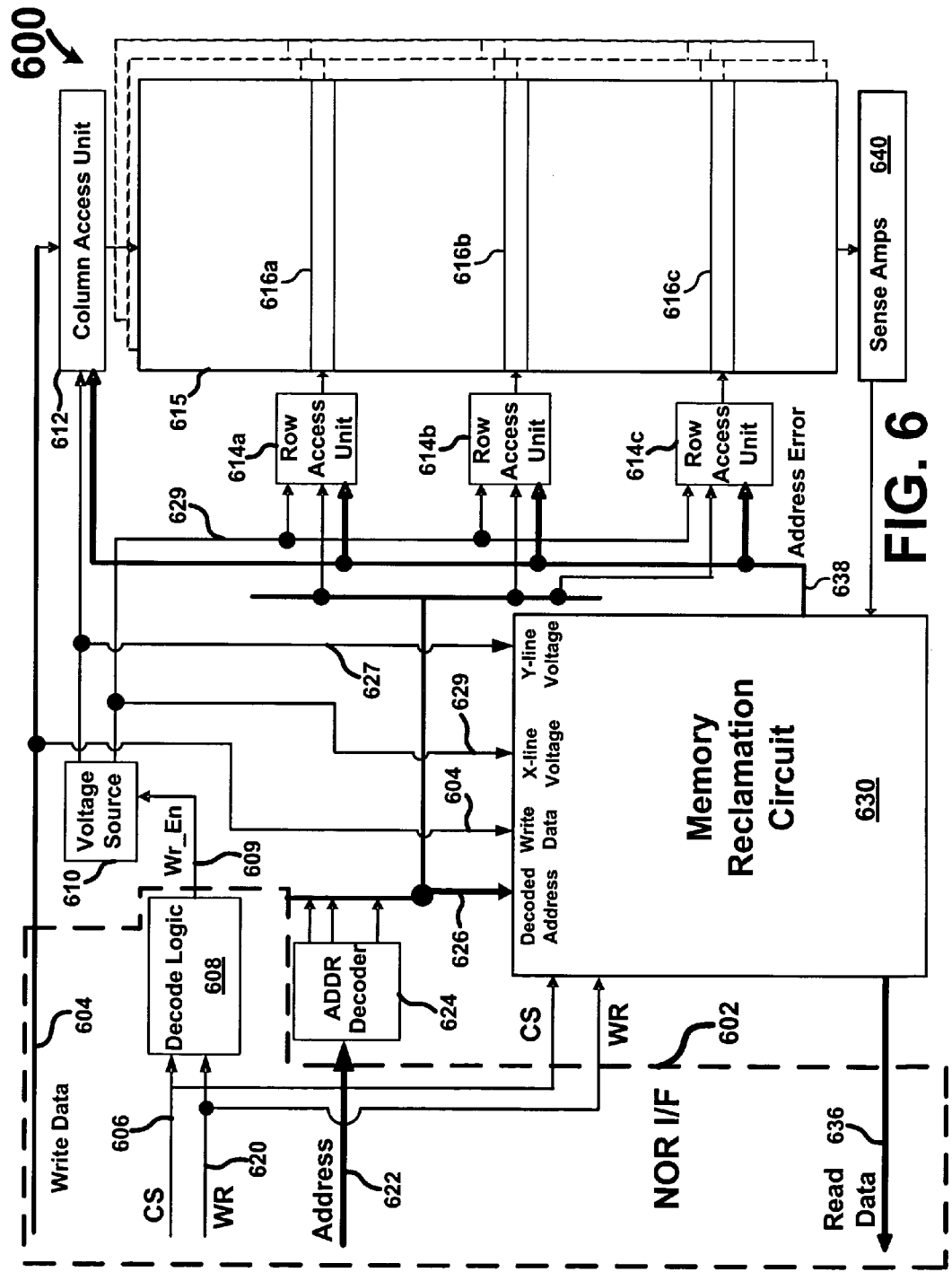
FIG. 6 depicts an example of a memory reclamation circuit implemented in a memory architecture that includes a NOR-type interface, according to one embodiment of the invention.

FIG. 6 depicts an example of a memory reclamation circuit implemented in a memory architecture that includes a NOR-type interface, according to one embodiment of the invention. As shown, memory architecture 600 includes a NOR-type interface ("NOR I/F") 602, an address ("ADDR") decoder 624, a voltage source 610, a column access unit 612, a number of row access units 614, sense amplifiers ("Amps") 640 and a third dimension memory array 615. Memory reclamation circuit 630, which operates in accordance to various embodiments as described herein, is configured to reclaim memory having defects in array 615 that otherwise would be rendered unavailable.

Address ("ADDR") decoder 624 is configured to decode address 622 into a decoded address 626, which relates to one of the outputs of address decoder 624. Voltage source 610 is configured to generate read voltages and write voltages as row access voltage ("X-line Voltage") 629 and column access voltage ("Y-line Voltage") 627, both of which can be applied to row access units 614 and column access units 612, respectively. Row access units 614 and column access units 612 operate in an equivalent manner as similarly-named elements described in FIG. 5. Row access units 614a, 614b, and 614c each operate to uniquely select a row, such as rows 616a, 616b, and 616c, respectively. In the example shown, memory reclamation circuit 630 is configured to transmit an address error signal 638 to each row access unit 614 and column access unit 612 to disable writes and reads to array 615, when an access relates to defective memory. For example, decoded address 626, row access voltage 629 and address error signal 638 can be logically ANDed together such that when address error signal 638 is low, all accesses to the rows 616 are disabled. Sense amplifiers ("Amps") 640 are configured to sense and generate read data for transmission as read data 636, when an access to array 615 relates to non-defective memory.

NOR-type interface ("NOR I/F") 602 is configured to provide control signals, address signals and data signals for accessing third dimension memory in either array 615 or alternate memory in memory reclamation circuit 630, or both. As shown, NOR-type interface 602 is adapted to provide separate channels for write data 604, address data 622, and read data 636. Further, NOR-type interface 602 provides channels for chip select ("CS") 606 and write enable ("WR") 620 signals. NOR-type interface 602 includes decode logic 608 for generating an internal write enable signal ("Wr_En") 609 to cause voltage source 610 to transmit write and/or read access voltages. As different memory technologies can implement NOR-type interfaces 602, such as SRAM devices, memory architecture 600 can emulate SRAM memory technologies, as well as NOR Flash memory technologies and the like. As such, the alternate memory in memory reclamation circuit 630 can be divided into individually-addressable bytes as subsets of substitute memory. Note that NOR-type interface 602 can implement more or fewer signals, as necessary, to emulate different memory technologies. Note, too, that while FIG. 6 depicts array 615 as one memory plane (e.g., implement in one layer of multiple memory layers), other arrays 615 in the Z dimension are shown in dashed lines.

Figure 7:
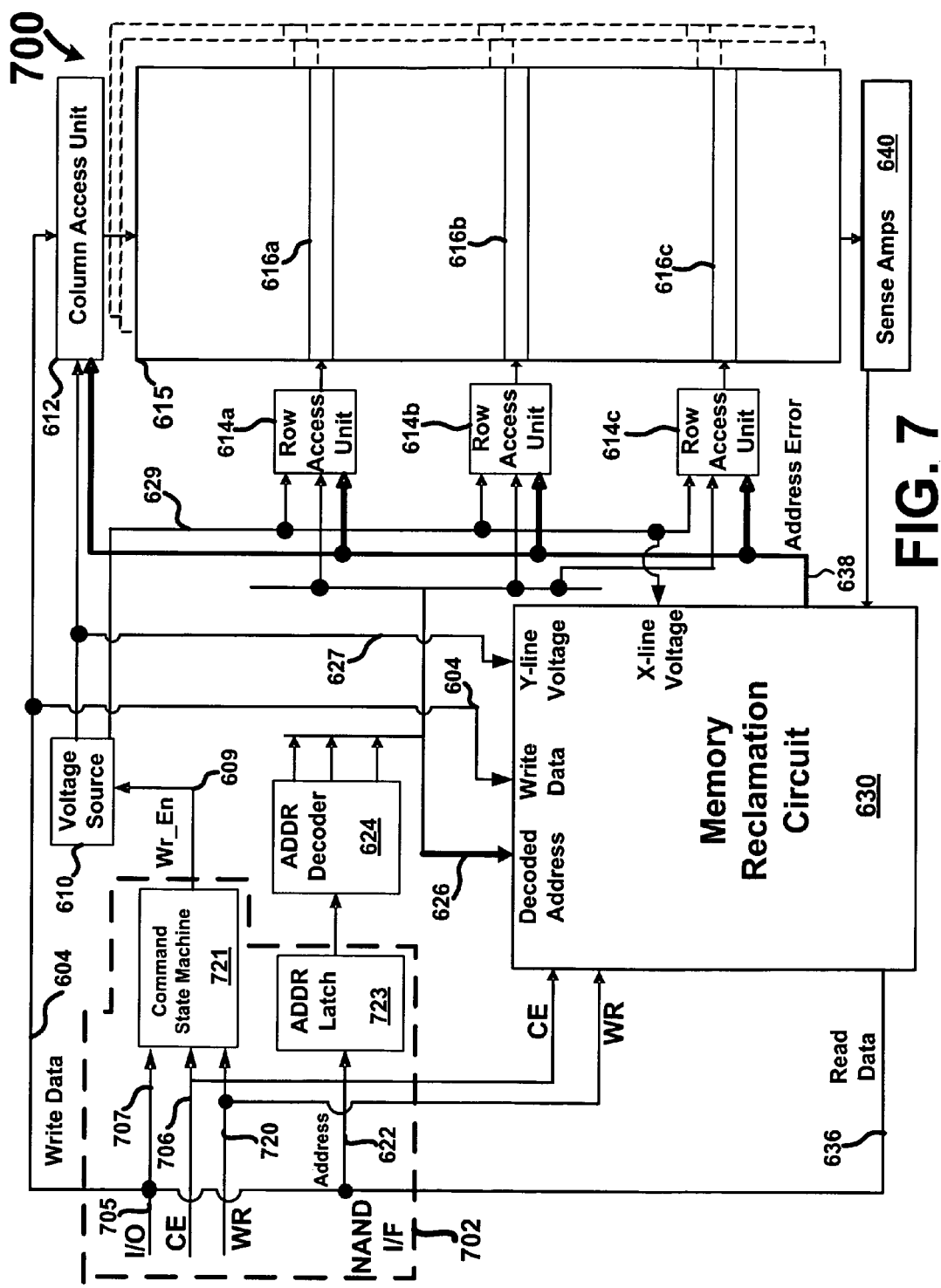
FIG. 7 depicts an example of a memory reclamation circuit implemented in a memory architecture that includes a NAND-type interface, according to another embodiment of the invention.

FIG. 7 depicts an example of a memory reclamation circuit implemented in a memory architecture that includes a NAND-type interface, according to another embodiment of the invention. As shown, memory architecture 700 includes a NAND-type interface ("NAND I/F") 702, as well as an address ("ADDR") decoder 624, a voltage source 610, a column access unit 612, a number of row access units 614, sense amplifiers ("Amps") 640, a third dimension memory array 615, and memory reclamation circuit 630. Note that elements in FIG. 7 that are also shown in FIG. 6 have similar functions and/or structures.

NAND-type interface ("NAND I/F") 702 is configured to provide control signals, address signals and data signals for accessing third dimension memory in either array 615 or alternate memory in memory reclamation circuit 630, or both. As shown, NAND-type interface 702 is adapted to provide a shared bus for write data 604, address data 622, read data 636, and command data 707 constituting commands. The shared bus is shown as I/O bus 705. Further, NAND-type interface 702 provides channels for chip enable ("CE") 706 and write enable ("WR") 720 signals. NAND-type interface 702 includes command state machine 721 configured to implement commands for performing, for example, write and read operations. When writing, command state machine 721 can generate, for example, an internal write enable signal ("Wr_En") 609. Address latch ("ADDR latch") 723 is configured to receive an address 622, generally over multiple bus cycles, and latched until used. Note that NAND-type interface 702 can implement more or fewer signals, as necessary, to emulate different memory technologies. Examples of such signals include address latch enable and command enable signals.

As different memory technologies can implement NAND-type interfaces 702, such as DRAM devices, memory architecture 700 can emulate DRAM memory technologies, as well as NAND Flash memory technologies and the like. Consider, for example, that memory architecture 700 is configured to emulate NAND Flash memory. As such, array 615 can be partitioned into blocks with memory cell replacement being made at the sector-level (e.g., row-level), in some embodiments. In at least one embodiment, memory cell replacement can be in groups of memory cells, such as a byte. Or, memory cell replacement can be individually replaced. In at least one embodiment, implementation of memory reclamation circuit 630 becomes more cost-effective as the number of memory cells (e.g., bits) in each row increases. In particular, the ratio of error and alternate bits to main memory gets smaller as the width of array 615 increases. Thus, increased efficiency can be realized in arrays having relatively long word lines. Note that this is typically the case in relation to NAND Flash memory designs for which memory architecture 700 emulates. In one instance, row 616a can include 512 bytes or more bytes. As such, the alternate memory in memory reclamation circuit 630 can be divided into individually-addressable sectors, or rows, of 512 bytes as subsets of substitute memory.

Figure 8:
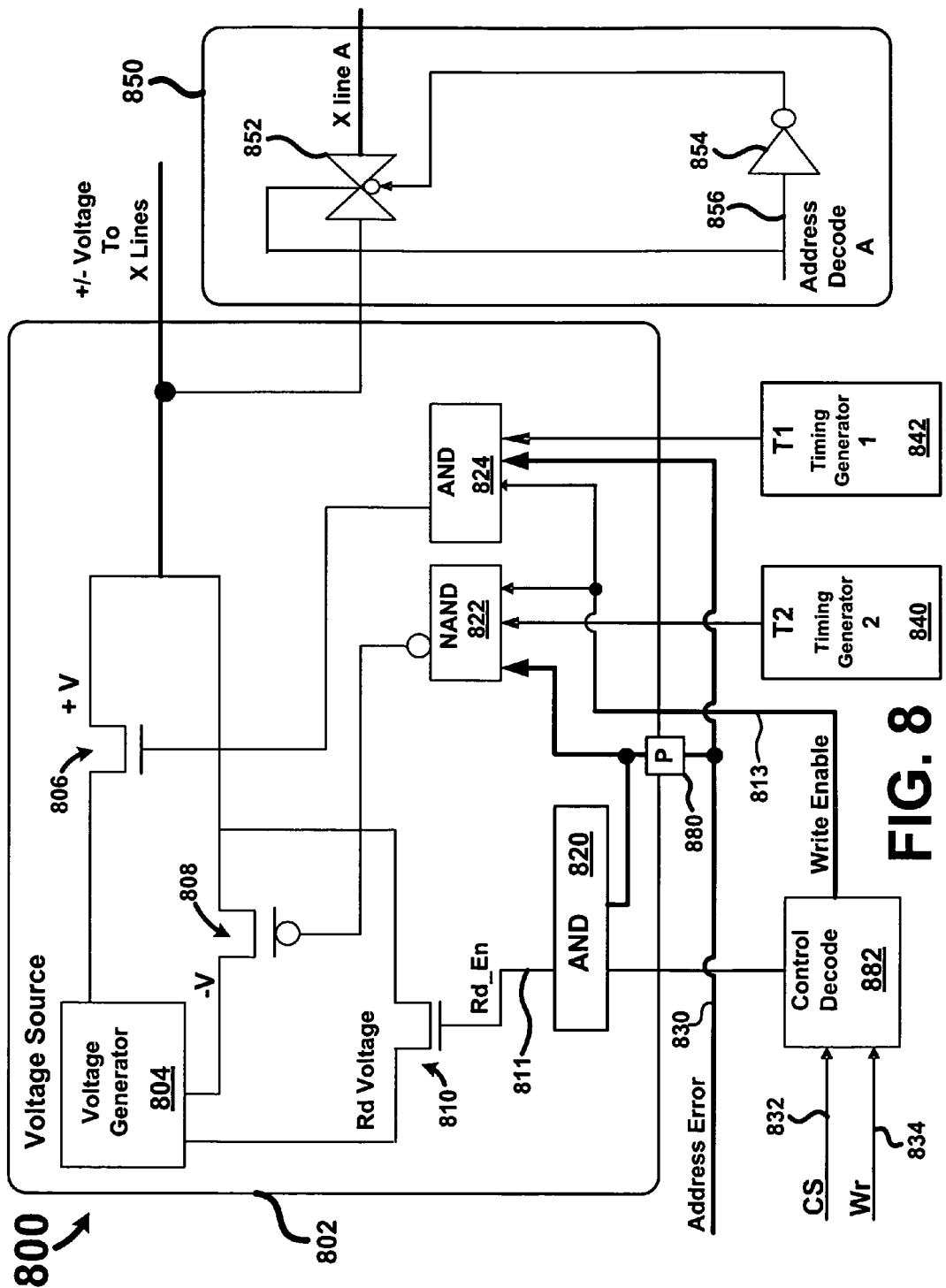
FIG. 8 is a diagram depicting an example of a voltage source for use with a memory reclamation circuit, according to an embodiment of the invention.

FIG. 8 is a diagram depicting an example of a voltage source for use with a memory reclamation circuit, according to an embodiment of the invention. In the example shown, voltage source 800 can be configured as an interruptible voltage source having an address error port ("P") 880. As such, interruptible voltage source 802, which typically provides access voltages to a main array, can be interrupted so as to suppress the transmission of the access voltages in response to an address error signal 830 at address error port 880. In this example, address error signal 830 need not be routed to row access units and column access units as described in other embodiments.

Voltage source 800 includes a voltage generator 804 configured to generate read voltages and write voltages as access voltages. It also includes devices 810, 808, and 806 for disabling transmission of access voltages to, for example, a row having a defect. Logic circuits 820, 822, and 824 are configured to respectively control operation of devices 810, 808, and 806 in response to address error signal 830 that, when low, disables reads and writes to a particular row. Control decode 882 generates read enable signals 811 when, for example, chip select ("CS") signal 832 is active, but write enable ("Wr") 834 is inactive. But when write enable 834 is active, internal write enable signal 813 enables writes to the main array. Timing generator ("1") 842 and timing generator ("2") 840 cooperate, when address error signal 830 is high (e.g., inactive), to generate timing signals to control the alternate application of negative write voltages ("−V") to write zeroes and positive write voltages ("+V") to write ones. Writing in this manner, at least for some third dimension memory cells, is a two-cycle operation with a positive voltage applied at T1 and a negative voltage applied at T2, both producing the positive and negative voltages driven down the row line selected by an address decode signal ("A") 856, which implements a circuit 850 to send an access voltage down the row for reading. Circuit 850 is an example of a gating circuit that includes an inverter 854 and a transmission gate 852, which enables transmission of a row access voltage to a single row as determined by address decode signal 856.

The invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An electrical system including embedded non-volatile memory configured to emulate NOR-Flash memory using non-Flash-based memory elements and including circuitry configured to reclaim defective memory in the embedded non-volatile memory, comprising:
    an integrated circuit including
        a first portion comprised of a semiconductor substrate including circuitry fabricated on a logic plane, and
        a second portion comprised of a single memory plane in contact with the semiconductor substrate, the second portion is vertically disposed above and is fabricated directly on top of the logic plane;
    at least one two-terminal cross-point memory array embedded in the single memory plane and including a plurality of first and second conductive array lines that are electrically coupled with at least a portion of the circuitry and a including a plurality of non-volatile two-terminal memory elements operative to store non-volatile data as a plurality of conductivity profiles,
    each two-terminal memory element is positioned at a cross-point of one of the plurality of first conductive array lines with one of the plurality of second conductive array lines and includes a first terminal electrically coupled with its respective first conductive array line and a second terminal electrically coupled with its respective second conductive array line,
    each two-terminal memory element including an electrolytic tunnel barrier having a thickness that is less than 50 Å and electrically coupled with the first terminal, the electrolytic tunnel barrier in contact with and electrically in series with a mixed valence conductive oxide having mobile oxygen ions and electrically coupled with the second terminal,
    the circuitry including a NOR-type Flash memory interface (NOR I/F) electrically coupled with a plurality of signals including control signals, address signals, and data signals for performing data operations on one or more of the plurality of two-terminal memory elements in the at least one two-terminal cross-point memory array, and
    the circuitry including a memory reclamation circuit configured to operate in a programming mode and a functional mode,
    wherein the programming mode is operative to receive defective memory location data indicative of address data for one or more defective two-terminal memory elements in the at least one two-terminal cross-point memory array and to write the defective memory location data to a defective memory list positioned in a first group of the at least one two-terminal cross-point memory array, and
    wherein the functional mode is operative to receive a memory address for a data operation on the at least one two-terminal cross-point memory array and to activate an address error signal if the memory address matches the defective memory location data in the defective memory list and operative to substitute a subset of the two-terminal memory elements positioned in a second group of the at least one two-terminal cross-point memory array for the one or more defective two-terminal memory elements.

2. The electrical system of claim 1, wherein the second group comprises an alternate third dimension memory.

3. The electrical system of claim 1, wherein the at least one two-terminal cross-point memory array is operative as a computer readable medium and at least a portion of the non-volatile data stored in the at least one two-terminal cross-point memory array comprises program instructions.

4. The electrical system of claim 3, wherein the NOR I/F is configured to initiate a data operation on the at least one two-terminal cross-point memory array operative to reversibly overwrite at least a portion of the program instructions when the plurality of signals comprise signals for a write operation.

5. The electrical system of claim 3, wherein the NOR I/F is configured to initiate a data operation on the at least one two-terminal cross-point memory array operative to read at least a portion of the program instructions when the plurality of signals comprise signals for a read operation.

6. The electrical system of claim 1, wherein the non-volatile data stored in each two-terminal memory element is non-destructively determined by applying a read voltage across the first and second terminals of the two-terminal memory element.

7. The electrical system of claim 6, wherein the circuitry includes sense amplifiers operative to sense a read current generated by the applying the read voltage and to output read data based on a value of the read current.

8. The electrical system of claim 1, wherein the non-volatile data stored in each two-terminal memory element is reversibly switchable between the plurality of conductivity profiles by applying a write voltage across the first and second terminals of the two-terminal memory element.

9. The electrical system of claim 1, wherein two-terminal memory elements not allocated to the first group or to the second group are allocated to a first memory array in the at least one two-terminal cross-point memory array.

10. The electrical system of claim 1, wherein each two-terminal memory element is a component of a two-terminal memory cell and the first terminal of the two-terminal memory element is electrically coupled with a first terminal node of the two-terminal memory cell and the second terminal of the of the two-terminal memory element is electrically coupled with a second terminal node of the two-terminal memory cell, and
    wherein the two-terminal memory element is electrically in series with the first and second terminal nodes of the two-terminal memory cell.

11. An electrical system including embedded non-volatile memory configured to emulate Flash memory using non-Flash-based memory elements and including circuitry configured to reclaim defective memory in the embedded non-volatile memory, comprising:
    an integrated circuit including
        a first portion comprised of a semiconductor substrate including circuitry fabricated on a logic plane, and
        a second portion comprised of a plurality of memory planes in contact with the semiconductor substrate, the second portion is vertically disposed above and is fabricated directly on top of the logic plane;
    at least one two-terminal cross-point memory array embedded in each of the plurality of memory planes, each two-terminal cross-point memory array including a plurality of first and second conductive array lines that are electrically coupled with at least a portion of the circuitry and a including a plurality of non-volatile two-terminal memory elements operative to store non-volatile data as a plurality of conductivity profiles, each two-terminal memory element is positioned at a cross-point of one of the plurality of first conductive array lines with one of the plurality of second conductive array lines and includes a first terminal electrically coupled with its respective first conductive array line and a second terminal electrically coupled with its respective second conductive array line, each two-terminal memory element including an electrolytic tunnel barrier having a thickness that is less than 50 Å and electrically coupled with the first terminal, the electrolytic tunnel barrier in contact with and electrically in series with a mixed valence conductive oxide having mobile oxygen ions and electrically coupled with the second terminal, the circuitry including a NAND-type Flash memory interface (NAND I/F) electrically coupled with a plurality of signals including control signals, address signals, and data signals for performing data operations on one or more of the plurality of two-terminal memory elements in one or more of the plurality of memory planes, and the circuitry including a memory reclamation circuit configured to operate in a programming mode and a functional mode, wherein the programming mode is operative to receive defective memory location data indicative of address data for one or more defective two-terminal memory elements in one or more of the plurality of memory planes and to write the defective memory location data to a defective memory list comprised of one or more non-defective two-terminal memory elements positioned in one or more of the plurality of memory planes, and wherein the functional mode is operative to receive a memory address for a data operation on two-terminal memory elements in one or more of the plurality of memory planes and to activate an address error signal if the memory address matches the defective memory location data in the defective memory list and operative to substitute a subset of other non-defective two-terminal memory elements in an alternate third dimension memory comprised of other non-defective two-terminal memory elements in one or more of the plurality of memory planes for the one or more defective two-terminal memory elements.

12. The electrical system of claim 11, wherein the defective memory list and the alternate third dimension memory are positioned in a first layer memory plane that is immediately adjacent to the first portion.

13. The electrical system of claim 12, wherein two-terminal memory elements in the first layer memory plane that are not allocated to the defective memory list or to the alternate third dimension memory are allocated to a first memory array.

14. The electrical system of claim 11, wherein each two-terminal memory element is a component of a two-terminal memory cell and the first terminal of the two-terminal memory element is electrically coupled with a first terminal node of the two-terminal memory cell and the second terminal of the of the two-terminal memory element is electrically coupled with a second terminal node of the two-terminal memory cell, and wherein the two-terminal memory element is electrically in series with the first and second terminal nodes of the two-terminal memory cell.

15. The electrical system of claim 11, wherein the non-volatile data stored in each two-terminal memory element is non-destructively determined by applying a read voltage across the first and second terminals of the two-terminal memory element.

16. The electrical system of claim 15, wherein the circuitry includes sense amplifiers operative to sense a read current generated by the applying the read voltage and to output read data based on a value of the read current.

17. The electrical system of claim 11, wherein the non-volatile data stored in each two-terminal memory element is reversibly switchable between the plurality of conductivity profiles by applying a write voltage across the first and second terminals of the two-terminal memory element.

18. The electrical system of claim 11, wherein the circuitry further includes a NOR-type Flash memory interface (NOR I/F) electrically coupled with a plurality of signals including control signals, address signals, and data signals for performing data operations on one or more of the plurality of two-terminal memory elements operative as a computer readable medium for non-volatile storage of program instructions.

19. The electrical system of claim 18, wherein the NOR I/F is configured to initiate a data operation operative to reversibly overwrite at least a portion of the program instructions when the plurality of signals comprise signals for a write operation.

20. The electrical system of claim 18, wherein the NOR I/F is configured to initiate a data operation operative to read at least a portion of the program instructions when the plurality of signals comprise signals for a read operation.

* * * * *